US012610832B2

(12) United States Patent
Stella et al.

(10) Patent No.: US 12,610,832 B2
(45) Date of Patent: *Apr. 21, 2026

(54) PACKAGED HIGH VOLTAGE MOSFET DEVICE WITH CONNECTION CLIP AND MANUFACTURING PROCESS THEREOF

(71) Applicant: STMICROELECTRONICS S.r.l., Agrate Brianza (IT)

(72) Inventors: Cristiano Gianluca Stella, San Gregorio di Catania (IT); Fabio Russo, Tremestieri Etneo (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 38 days.

This patent is subject to a terminal disclaimer.

(21) Appl. No.: 18/493,686

(22) Filed: Oct. 24, 2023

(65) Prior Publication Data

US 2024/0136260 A1 Apr. 25, 2024
US 2024/0234263 A9 Jul. 11, 2024

Related U.S. Application Data

(63) Continuation of application No. 17/367,086, filed on Jul. 2, 2021, now Pat. No. 11,830,794.

(30) Foreign Application Priority Data

Jul. 10, 2020 (IT) ......................... 102020000016840

(51) Int. Cl.
H01L 23/495 (2006.01)
H01L 21/48 (2006.01)
(Continued)

(52) U.S. Cl.
CPC .... H01L 23/49568 (2013.01); H01L 21/4825 (2013.01); H01L 21/565 (2013.01);
(Continued)

(58) Field of Classification Search
CPC ........... H01L 23/49568; H01L 23/3107; H01L 23/49527; H01L 23/49562;
(Continued)

(56) References Cited

U.S. PATENT DOCUMENTS 6,236,098 B1 5/2001 Efland et al.
8,502,274 B1 * 8/2013 Matoy ................... H01L 23/528
257/210

(Continued)

FOREIGN PATENT DOCUMENTS

EP 3561867 A1 10/2019
WO WO 2016117075 A1 7/2016

*Primary Examiner* — Joseph C. Nicely
(74) *Attorney, Agent, or Firm* — Seed Intellectual Property Law Group LLP

(57) ABSTRACT

An HV MOSFET device has a body integrating source conductive regions. Projecting gate structures are disposed above the body, laterally offset with respect to the source conductive regions. Source contact regions, of a first metal, are arranged on the body in electric contact with the source conductive regions, and source connection regions, of a second metal, are arranged above the source contact regions and have a height protruding with respect to the projecting gate structures. A package includes a metal support bonded to a second surface of the body, and a dissipating region, above the first surface of the semiconductor die. The dissipating region includes a conductive plate having a planar face bonded to the source connection regions and spaced from the projecting gate structures. A package mass of dielectric material is disposed between the support and the dissipating region and incorporates the semiconductor die. The dissipating region is a DBC-type insulation multilayer.

20 Claims, 10 Drawing Sheets

(51) Int. Cl.
H01L 21/56 (2006.01)
H01L 23/31 (2006.01)

(52) U.S. Cl.
CPC .... H01L 23/3107 (2013.01); H01L 23/49527 (2013.01); H01L 23/49562 (2013.01); H01L 23/49575 (2013.01)

(58) Field of Classification Search
CPC ........... H01L 23/49575; H01L 21/4825; H01L 21/565; H01L 23/5329; H10D 64/251
See application file for complete search history.

(56) References Cited

U.S. PATENT DOCUMENTS

| | | | |
|---|---|---|---|
| 9,986,361 B2 | 5/2018 | Chon et al. | |
| 9,986,631 B2 | 5/2018 | Rizza et al. | |
| 10,720,373 B2 | 7/2020 | Salamone et al. | |
| 2004/0016979 A1 | 1/2004 | Kawano et al. | |
| 2006/0163648 A1 | 7/2006 | Hauenstein et al. | |
| 2006/0180916 A1 | 8/2006 | Wyland | |
| 2007/0138651 A1 | 6/2007 | Hauenstein | |
| 2007/0145573 A1* | 6/2007 | Otremba | H01L 24/33 |
| | | | 257/E23.044 |
| 2007/0290311 A1 | 12/2007 | Hauenstein | |
| 2008/0054439 A1 | 3/2008 | Malhan et al. | |
| 2009/0079006 A1 | 3/2009 | Tanaka et al. | |
| 2009/0102067 A1 | 4/2009 | Wyland | |
| 2010/0133670 A1* | 6/2010 | Liu | H01L 23/49524 |
| | | | 438/122 |
| 2010/0164078 A1 | 7/2010 | Madrid et al. | |
| 2011/0132431 A1 | 6/2011 | Linderman et al. | |
| 2011/0227205 A1* | 9/2011 | Lu | H01L 24/84 |
| | | | 438/109 |
| 2012/0104580 A1 | 5/2012 | Feng et al. | |
| 2013/0015468 A1* | 1/2013 | Kikuchi | H01L 23/36 |
| | | | 257/77 |
| 2013/0168728 A1* | 7/2013 | Lee | H10D 62/142 |
| | | | 257/E29.198 |
| 2013/0307156 A1 | 11/2013 | Bayerer | |
| 2014/0159212 A1 | 6/2014 | Hung et al. | |
| 2014/0246783 A1 | 9/2014 | Nishizawa et al. | |
| 2015/0255380 A1 | 9/2015 | Chen | |
| 2015/0311144 A1 | 10/2015 | Williams et al. | |
| 2015/0380384 A1 | 12/2015 | Williams et al. | |
| 2016/0181361 A1* | 6/2016 | Shea | H10D 30/668 |
| | | | 257/341 |
| 2016/0204046 A1 | 7/2016 | Iwashige | |
| 2016/0293714 A1 | 10/2016 | Hutzler et al. | |
| 2018/0138136 A1 | 5/2018 | Tonegawa | |
| 2018/0233424 A1 | 8/2018 | Sung et al. | |
| 2018/0240876 A1* | 8/2018 | Tu | H10D 86/01 |
| 2019/0311976 A1* | 10/2019 | Salamone | H01L 23/49531 |
| 2019/0326208 A1* | 10/2019 | Stella | H01L 23/49844 |
| 2019/0386133 A1 | 12/2019 | Boianceanu et al. | |
| 2020/0135871 A1* | 4/2020 | Tsai | H01L 21/76856 |
| 2020/0303507 A1* | 9/2020 | Yilmaz | H10D 64/117 |
| 2021/0118768 A1* | 4/2021 | Choi | H01L 25/072 |
| 2021/0134998 A1* | 5/2021 | Sundaresan | H10D 30/665 |
| 2021/0238102 A1* | 8/2021 | Terasaki | C04B 37/023 |
| 2023/0326849 A1* | 10/2023 | Wu | H01L 21/76897 |
| | | | 257/774 |
| 2025/0006603 A1* | 1/2025 | Liu | H01L 23/49811 |

* cited by examiner

PACKAGED HIGH VOLTAGE MOSFET DEVICE WITH CONNECTION CLIP AND MANUFACTURING PROCESS THEREOF

BACKGROUND

Technical Field

The present disclosure relates to a packaged high voltage MOSFET device having connection clip and to the manufacturing process thereof.

Description of the Related Art

As known, high voltage and/or high current MOSFET devices are widely used in applications, e.g., power conversion, wherein they are subject to high or very high biasing voltages (with values even up to 1000-2000 V) and are crossed by currents that may switch quickly.

Therefore, particular measures are required in these devices for forming the package, so as to ensure the required electrical insulation and a suitable separation distance between the leads associated with the gate, source and drain terminals, and so as to ensure a desired heat dissipation to the outside.

The high voltage and/or current MOSFET devices are formed in a die of semiconductor material, typically silicon, which has a first main surface (normally a rear surface) carrying a drain pad, and a second main surface (normally a front surface), opposite to the first main surface, carrying source pads and gate pads.

The die is bonded to a conductive support called "leadframe," provided with leads for the external connection of the MOSFET device terminals. In particular, the drain pad is generally bonded to a leadframe carrying portion, which also has a heat dissipation function; gate and source leads are coupled to the gate and, respectively, source pads through bonding wires or clamps or clips. The die/leadframe assembly is packaged in a mass of resin or other packaging insulating material.

Traditional packages for MOSFET devices are generally arranged vertically and comprise pins projecting downwards from a single bottom side of the package structure (generically of a parallelepiped shape), for electrical coupling to a PCB (Printed Circuit Board). A suitable heat sink, typically a metal lamina, is coupled to the package structure, also arranged vertically with respect to the PCB.

To obtain increasingly compact size as regards thickness, horizontal packages, for example of the SMD (Surface Mounting Device) type, have been developed.

For example, Italian patent No. 102018000004209 (corresponding to U.S. Pat. No. 10,720,373) describes a power semiconductor device formed by a die and a package housing the die. The die has a plurality of projecting gate regions, reciprocally separated by windows having contact regions arranged therein. A dissipating plate, formed by an insulating multilayer, is arranged above the die and comprises a bottom metal layer counter-shaped to the projecting gate regions. In detail, the bottom metal layer has contact projections extending within the windows and electrically contact the contact regions.

BRIEF SUMMARY

In various embodiments, the present disclosure provides improved packaged high voltage MOSFET devices to allow its use for applications where very high voltages and, possibly, a high current capability are desired.

According to the present disclosure, a packaged high voltage HV MOSFET device and a manufacturing process thereof are provided.

In at least one embodiment, a packaged high voltage (HV) MOSFET device is provided that includes a body including a plurality of source conductive regions and having a first and a second surface. A plurality of projecting gate structures are arranged on the first surface of the body, with the projecting gate structures laterally offset with respect to the source conductive regions. A plurality of source contact regions, of a first metal, are arranged on the first surface of the body and in electric contact with the source conductive regions. A plurality of source connection regions, of a second metal, extend above the source contact regions and have a height protruding with respect to the projecting gate structures. A package houses the semiconductor die therein, and the package includes a metal support, a dissipating region, and a package mass of dielectric material. The metal support is bonded to the second surface of the semiconductor die. The dissipating region extends above the first surface of the body and includes a conductive plate having a planar face bonded to the source connection regions and spaced from the projecting gate structures. The package mass extends between the support and the dissipating region and incorporates the semiconductor die.

In at least one embodiment, a process for manufacturing a high voltage (HV) MOSFET device is provided that includes: forming a semiconductor die having a body including a plurality of source conductive regions and having a first and a second surface; forming a plurality of projecting gate structures on the first surface of the body, the projecting gate structures laterally offset with respect to the source conductive regions; forming a plurality of source contact regions, of a first metal, on the first surface of the body and in electric contact with the source conductive regions; forming a plurality of source connection regions, of a second metal, above the source contact regions and having a height protruding with respect to the projecting gate structures; and forming a package, housing the semiconductor die therein, including: bonding the semiconductor die to a metal support coupling the second surface of the body to the support; coupling the first surface of the body to a dissipating region including a conductive plate having a planar face by bonding the planar face of the conductive plate to the source connection regions so that the planar face of the conductive plate extends at a distance from the projecting gate structures; and feeding a package mass of dielectric material so that it fills spaces between the support and the dissipating region and incorporates the semiconductor die, forming a package.

BRIEF DESCRIPTION OF THE SEVERAL VIEWS OF THE DRAWINGS

For a better understanding of the present disclosure, embodiments thereof are now described, purely by way of non-limiting example, with reference to the accompanying drawings, wherein.

DETAILED DESCRIPTION

Figure 1A:
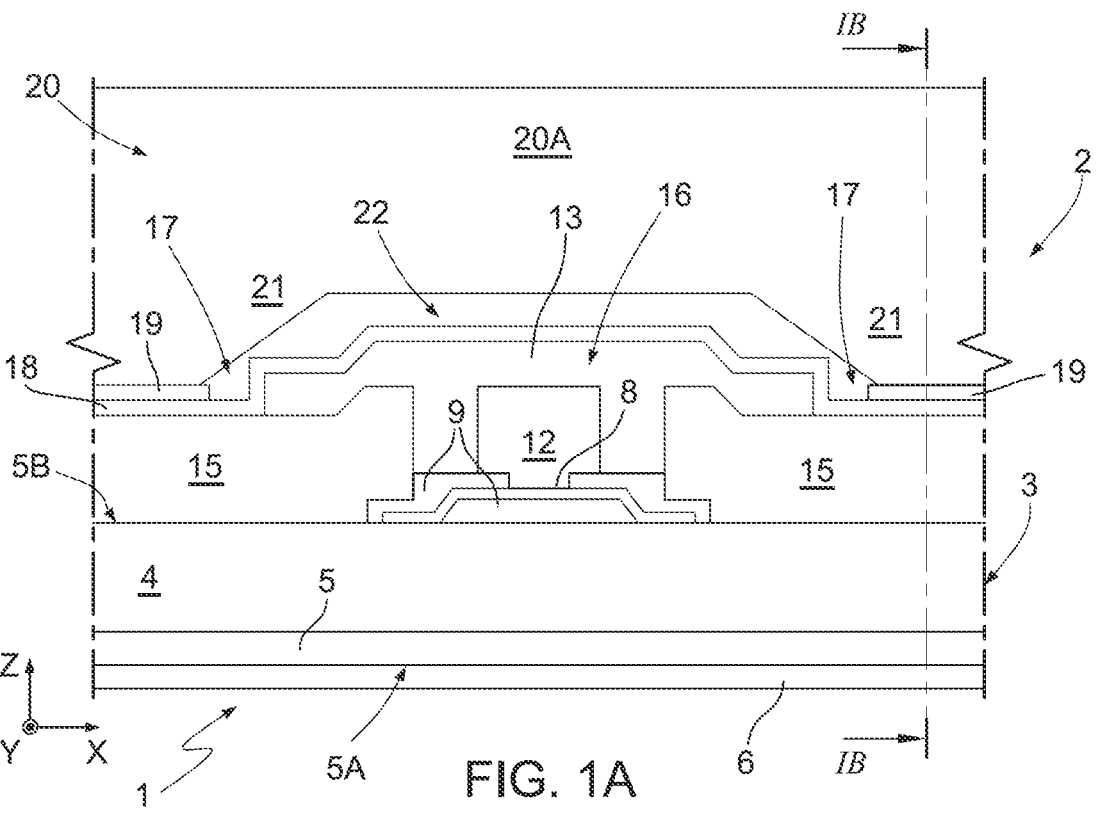
FIG. 1A is a cross-section of a portion of a power MOSFET device, taken along section line IA-IA of FIG. 1B.

FIGS. 1A, 1B, 2 and 3 illustrate a comparative example of embodiments relating, respectively, to two cross-sections of a portion of the power semiconductor device, indicated with 1, to a perspective view of the dissipating plate, indicated with 2, and to a top view of the die, indicated with 3. The die 3 accommodates a plurality of elementary units (or cells) of MOSFET transistor, arranged in strips having a vertical, pillar structure. In particular, FIG. 1 shows a portion of the power device 1 forming an elementary unit. In the simplified representation, shown in FIGS. 2, 3, the die 3 comprises three elementary units, although the number of elementary units may vary according to design needs and in particular to the values of the operative electrical quantities for the power device 1.

The die 3 comprises a substrate 5, of silicon, forming a drain region, having a rear surface 5A where a first metal layer 6 extends forming a drain metallization. The substrate 5 integrates conductive regions of which only body regions 4 and source regions 7 are shown in FIG. 1B.

Figure 1B:
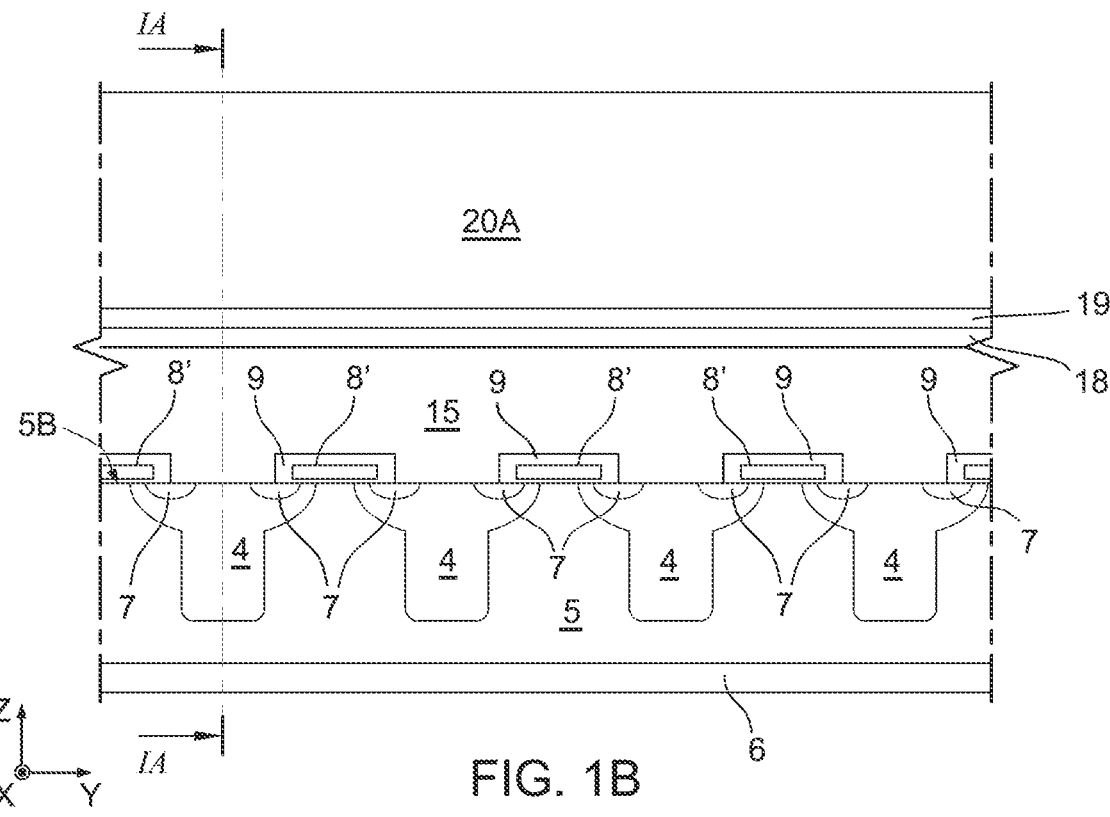
FIG. 1B is a cross-section of the MOSFET device of FIG. 1A, taken along section line IB-IB of FIG. 1A.
Figure 3:
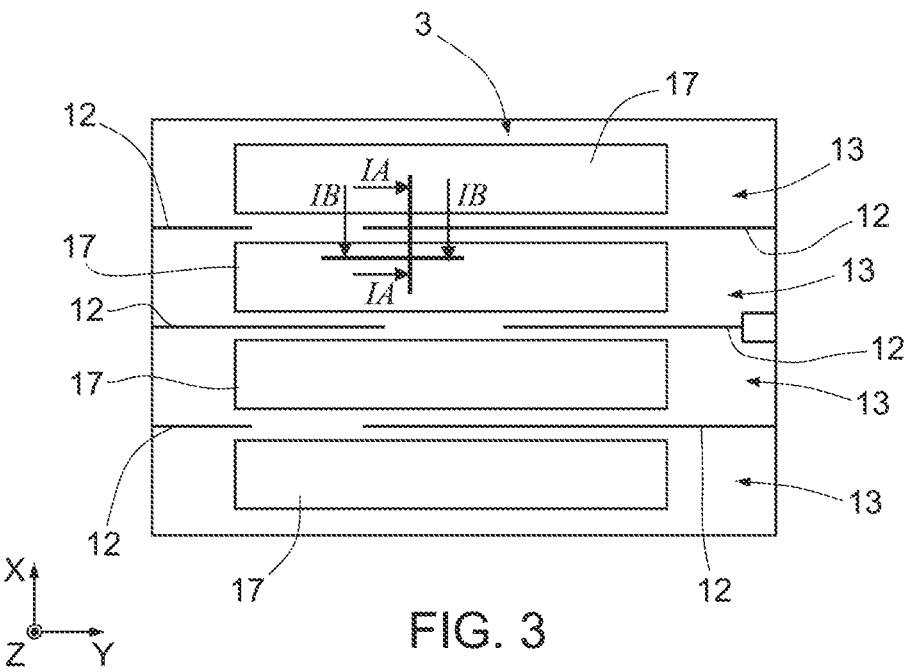
FIG. 3 is a schematic top view of the power MOSFET device before coupling the dissipating plate 2 to the die 3.

FIG. 1A also shows a gate conductive region 8 (connected to transverse gate portions 8' visible in FIG. 1B); the gate conductive region 8 and the transverse gate portions 8' are arranged on a front surface 5B of the substrate 5 and are surrounded by gate insulation regions 9 formed, in a known manner, by a field oxide layer (below the gate conductive regions 8 and the transverse gate portions 8') and by an intermetal oxide layer (on the gate conductive regions 8 and the transverse gate portions 8'). Gate contact regions 12, of metal (gate metallization 12, only one visible in FIG. 1A), extend above the gate conductive regions 8, in electric contact therewith, surrounded on the side and on the top by gate passivation regions 13. Each gate contact region 12 extends approximately for all the length of the strip forming the elementary unit (in a direction parallel to a first Cartesian axis Y), as shown in FIG. 3, where the gate contact regions 12 (so-called gate fingers) are represented in a simplified manner through lines. The gate contact regions 12 allow biasing of all the gate conductive regions 8 and of the transverse gate portions 8' of the power device 1 and may be continuous or, as in the illustrated example, have interruptions along their longitudinal extension and be interrupted.

Source contact regions 15 (source metallization 15), for example of AlCu, extend above the substrate 5, laterally to the gate insulation regions 9 and to the gate passivation regions 13. The source contact regions 15 are formed by bars 15A extending for the entire length of the strips forming the elementary units, in contact with the substrate 5 (where they are in contact with the source regions 7, FIG. 1B). In practice, the source contact regions 15 extend between the gate passivation regions 13 of adjacent elementary units.

As noted in FIG. 1A, in each elementary unit, the source contact regions 15 have top surfaces extending at a lower level than the gate passivation regions 13; in practice, the latter extend in part above the source contact regions 15; therefore the metal gate regions 12 and the gate passivation regions 13 project in height with respect to the source contact regions 15 and form thereby projecting gate regions 16 laterally delimiting windows 17 also shown in FIG. 3.

A thin metal layer 18 (e.g., of TiNiVAg) covers the source contact regions 15 (whereto it is electrically connected) and the gate passivation regions 13 and is bonded to the dissipating plate 2 through a solder layer 19.

Figure 2:
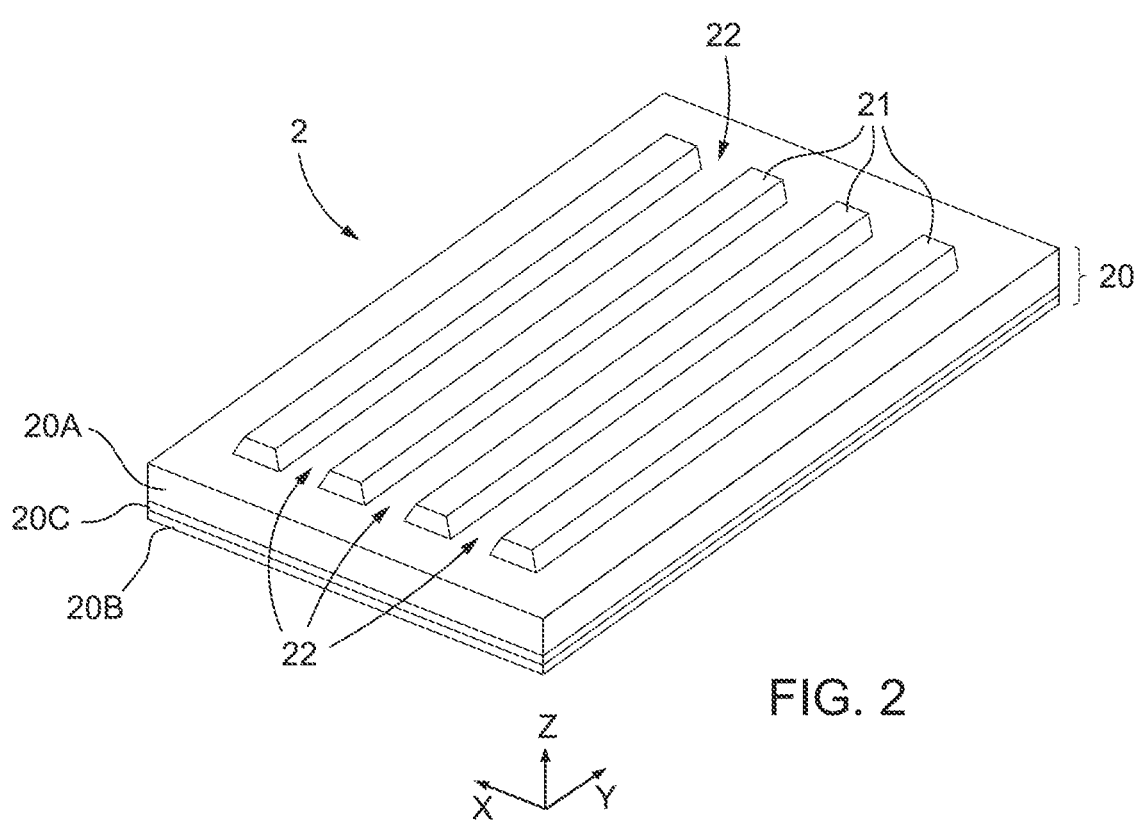
FIG. 2 is a perspective bottom view of a part of the power MOSFET device.

The dissipating plate 2 is for example formed by a DBC (Direct Bonded Copper) multilayer formed, as shown in FIG. 2, by a bottom metal layer 20A, a top metal layer 20B, both of copper, and an intermediate insulating layer 20C of ceramic, e.g., alumina ($Al_2O_3$), aluminum nitride (AlN) or beryllium oxide (BeO). The layers 20A-20C are coupled together through high temperature eutectic direct bonding. The intermediate insulating layer 20C electrically insulates the bottom and top metal layers 20A, 20B; the bottom layer 20A is bonded to the die 3 through a connecting portion, not shown.

The bottom layer 20A is shaped to form projecting portions 21 among which cavities 22 extend. As noted in FIG. 2, the projecting portions 21 and the cavities 22 extend practically for the entire length of the dissipating plate 2, parallel to the elementary units formed by the die 3 (parallel to the first Cartesian axis Y). The dissipating plate 2 is bonded to the die 3 so that the projecting zones 21 extend in the windows 17 (FIG. 1) and are soldered to the die 3 at the source contact regions 15 (and are electrically in contact with them through the thin metal layer 18 and the solder layer 19, as visible in FIG. 1A). Furthermore, each cavity 22 overlies, at a distance, a respective projecting gate region 16.

The above described solution allows a very compact structure to be obtained even for power devices operating at high voltage (up to 1600-2000 V), with the possibility of cooling on both sides and electrical insulation on one or two bigger sides.

However, it is rather complex to manufacture, since the dissipating plate 2 is specifically extruded on the basis of the specific die 3. The projecting portions 21 and the cavities 22 of the bottom layer 20A are thus designed specifically and suitably to the specific layout of the die 3. In particular, the arrangement and the size of the projecting portions 21 and of the cavities 22 are to be studied as the number, the width and/or length of the elementary units, the projecting gate regions 16 and the windows 17 of the die 3 vary.

Furthermore, placing the dissipating plate 2 is delicate and critical: in fact the projections 21 are to be arranged exactly at and aligned with the windows 17, avoiding contact with the projecting gate regions 16 and, in particular, with the gate passivation regions 13. In fact, any incorrect placing operations may lead to damage the gate passivation regions 13, with the risk of losing the electrical insulation between the gate contact regions 12 and the thin metal layer 18, which would lead to the failure of the power semiconductor device 1.

Figure 4A:
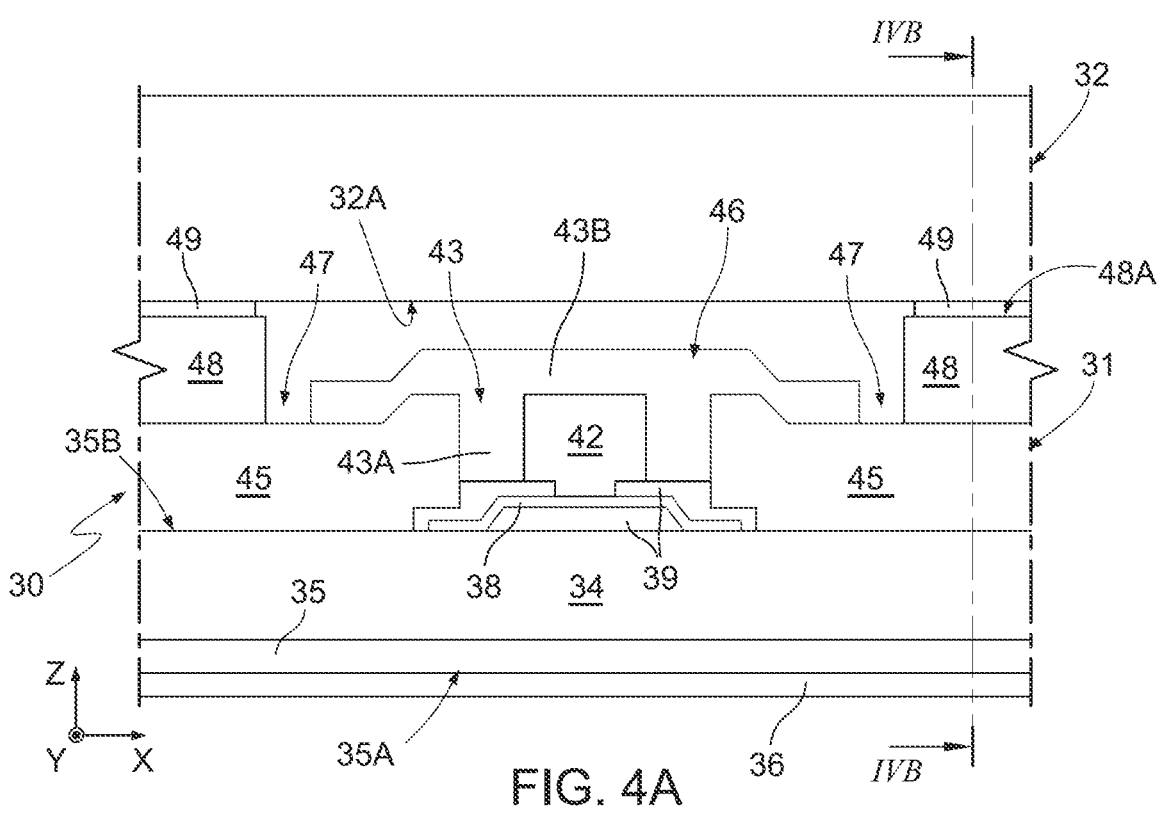
FIG. 4A is a cross-section of a portion of a high voltage device, taken along section line IVA-IVA of FIG. 4B.
Figure 4B:
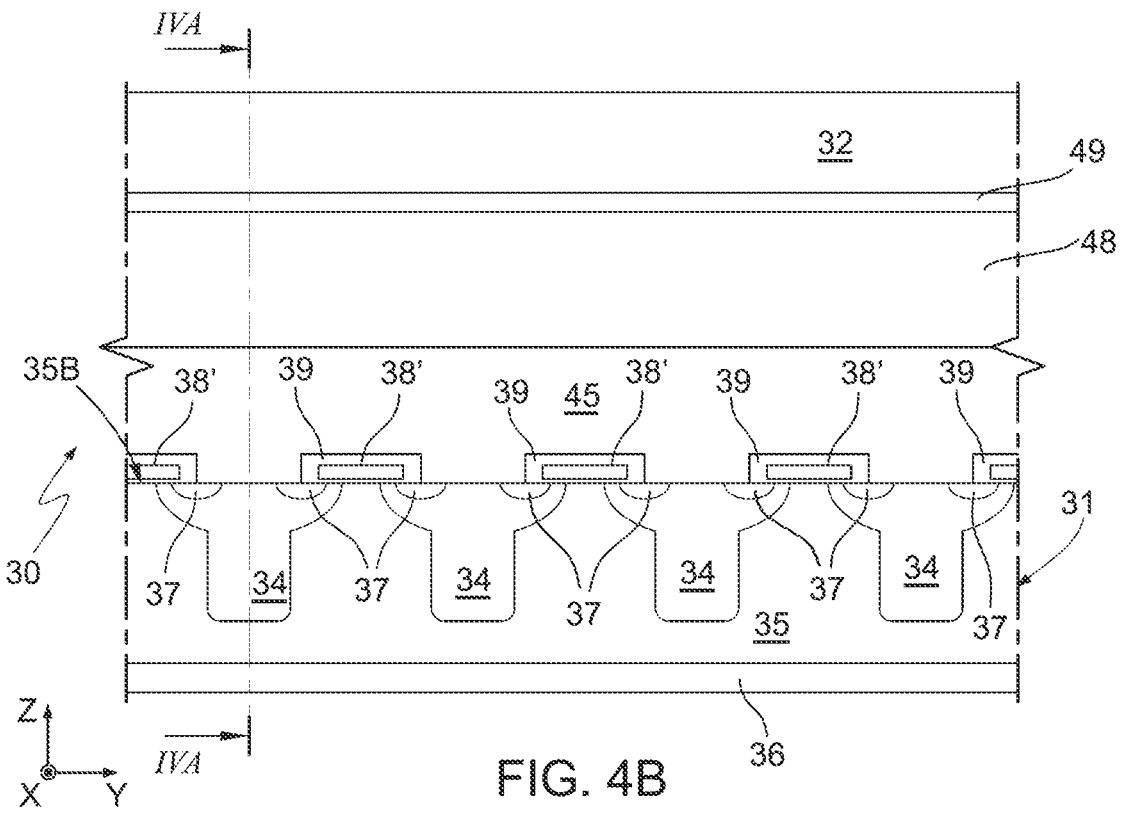
FIG. 4B is a cross-section of the device of FIG. 4A, taken along section line IVB-IVB of FIG. 4A.
Figure 5:
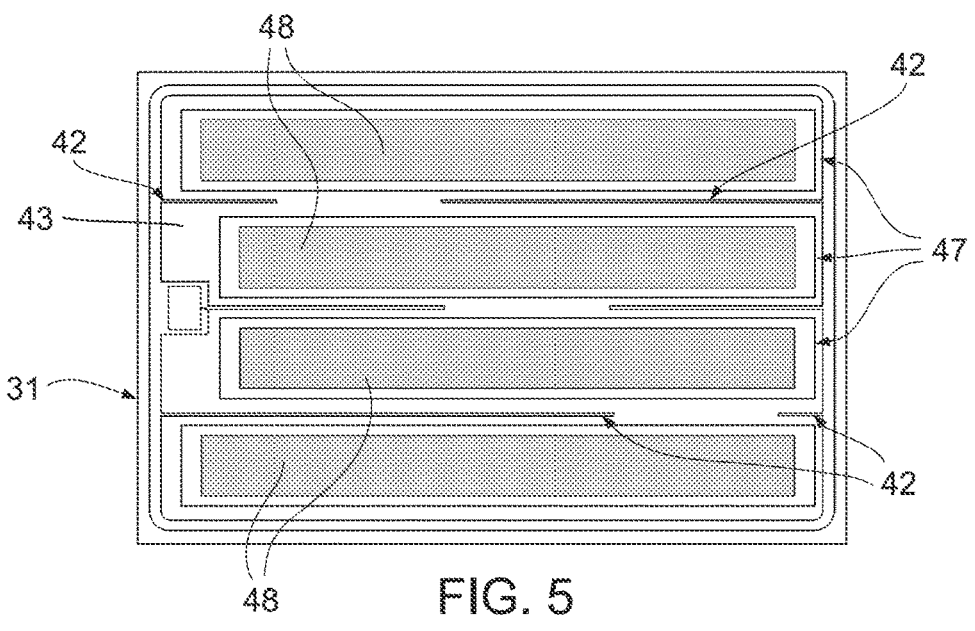
FIG. 5 is a schematic top view of a die of a high voltage device, before coupling to a dissipating plate.

FIGS. 4A, 4B and 5 show a high voltage MOSFET device 30 having a general structure similar to the power semiconductor device 1 of FIG. 1 and thus only briefly described as regards the common parts.

As in the power semiconductor device 1 of FIG. 1, the high voltage MOSFET device 30 comprises a die 31 bonded to a dissipating plate 32 and accommodating a plurality of elementary units (or cells) of MOSFET transistor, arranged in strips having a vertical, pillar structure.

In particular, FIG. 4A shows a portion, forming an elementary unit, of the high voltage MOSFET device 30. In the simplified representation shown in FIG. 5, the die 31 comprises three elementary units, although the number of elementary units may vary according to design specifications.

The die 31 comprises a substrate 35, of silicon of a first conductivity type, forming a drain region, having a rear surface 35A where a drain metallization 36 extends. As visible in the cross-section of FIG. 4B, body regions 34 and source regions 37, of a second conductivity type, extend in the substrate 35 and face a front surface 35B of the substrate 35.

In the elementary unit shown in FIG. 4A, a gate conductive region 38 is arranged on the front surface 35B of the substrate 35 and is surrounded by a gate insulation region 39 interrupted only at one point to allow the electrical connection between the gate conductive region 38 and a gate contact region 42, of metal, extending on the gate conductive region 38.

In a known manner, the gate conductive regions 38 are connected to transverse gate portions 38' visible in FIG. 4B and also surrounded by respective portions of the gate insulation region 39.

Each gate contact region 42 is surrounded on the side and on the top by a gate passivation region 43 comprising bottom portions 43A and a top portion 43B, formed from one or more dielectric layers. Each gate contact region 42 extends approximately for the entire length of the strip forming the elementary unit (parallel to a first Cartesian axis Y), but may be interrupted, as shown in FIG. 5. The gate contact regions 42 allow biasing of all the gate conductive regions 38 and the transverse gate portions 38' of the elementary units of the high voltage device 30 and may be continuous or, as in the illustrated example, have interruptions along the longitudinal extension thereof.

Source contact regions 45, e.g., of AlCu, for a thickness comprised between 3 and 6 μm, extend above the substrate 35, laterally to the gate insulation region 39 and to the gate passivation region 43. The source contact regions 45 extend for the entire length of the elementary unit, parallel to the first Cartesian axis Y, in contact with the substrate 35 (where they are in contact with the source 37 and body regions 34), between the gate passivation regions 43 of adjacent elementary units.

The top part 43B of the gate passivation region 43 extends at an upper level than the source contact regions 45 and is partially arranged thereabove. The metal gate region 42 and the gate passivation region 43 thus form projecting gate regions 46 higher than the source contact regions 45 and laterally delimiting windows 47 (see also FIG. 5).

Figure 6A:
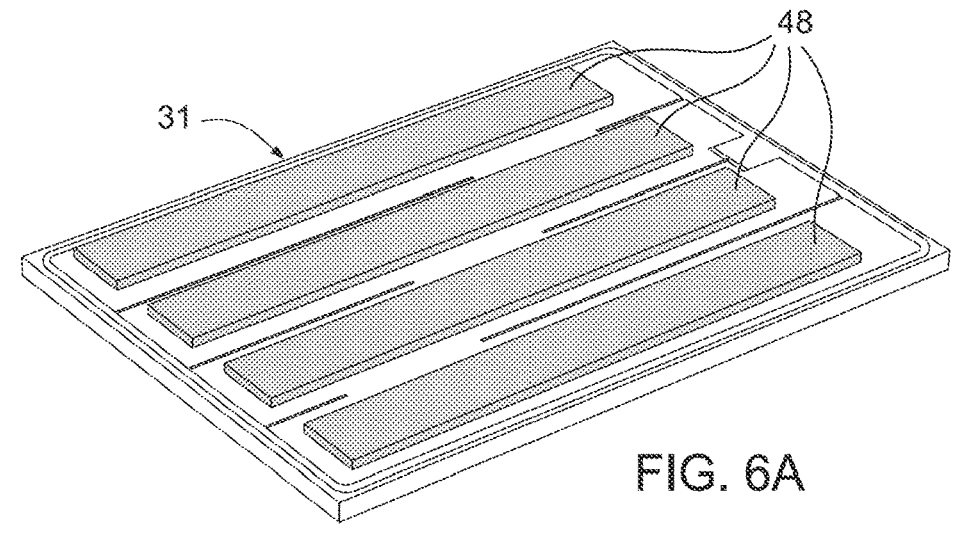
FIGS. 6A and 6B are perspective top views of the die of FIG. 5 before and, respectively, after coupling to the dissipating plate of a high voltage device.

Source connection regions 48, of metal and high thickness, extend above the bars 45, in electric contact therewith, within the windows 47. The source connection regions 48, e.g., of copper, have a thickness causing them to project from the windows 47 so that the top surface thereof, indicated with 48A in FIG. 4, projects from the windows 47 and is at a higher level than the top part 43B of the gate passivation region 43 (see also FIG. 6A). The source connection regions 48 may have a thickness comprised between 2 and 15 μm, e.g., of 10 μm.

Figure 6B:
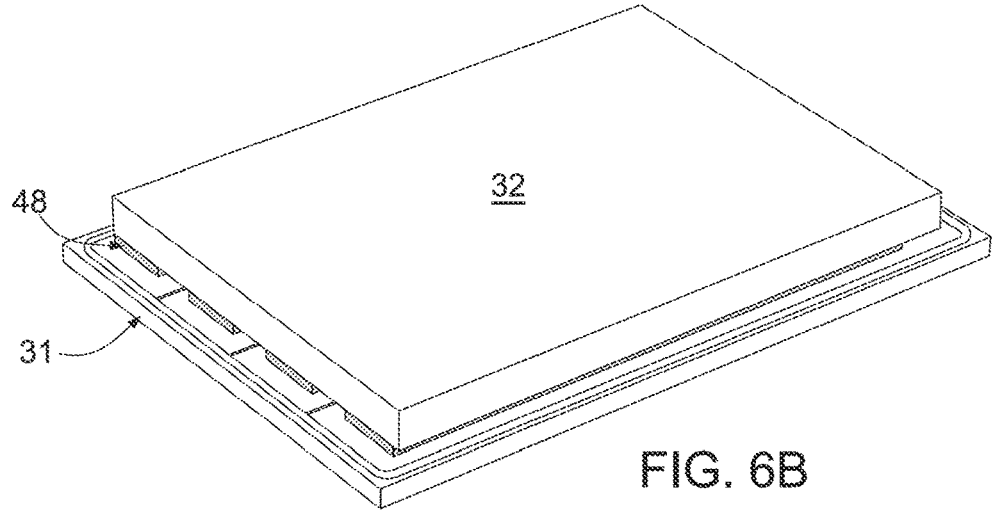

Here, the dissipative plate 32 has a parallelepiped shape, with a flat and planar bottom surface 32A, coupled to the source connection regions 48 through solder portions 49, as also shown in FIG. 6B. Thus, the dissipative plate 32 is in electric contact with the source regions 37 and forms, in this embodiment, a source pad.

Since the source connection regions 48 have a height projecting from the windows 47, the dissipative plate 32 extends vertically at a distance from the gate passivation regions 43 and thus from the gate contact regions 42. Therefore, the dissipative plate 32 is safely electrically insulated from the gate contact regions 42.

Since the dissipative plate 32 has a flat bottom surface allows it to have standard size, regardless of the structure of the specific die 31, in particular regardless of the number, shape and size of the projecting gate regions 46, as discussed hereinbelow. Therefore, it simplifies the manufacturing process of the high voltage MOSFET device 30, as described below, and placing and soldering thereof are not critical.

The manufacturing process of the HV MOSFET device 30 comprises known initial steps for forming electrically active regions of the device within and on the surface of the substrate 35.

Figures 7, 8:
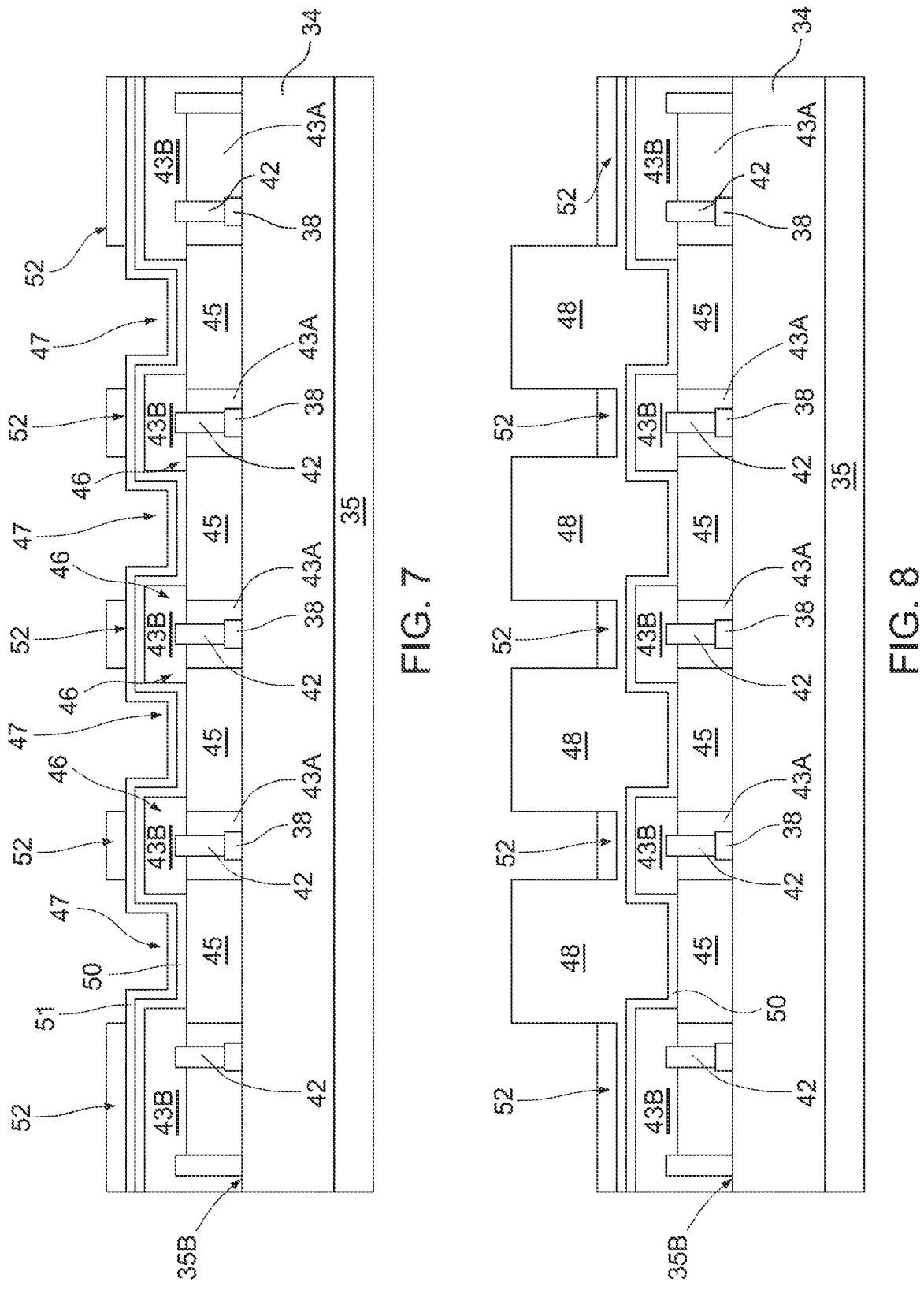
FIGS. 7-10 are cross-sections of the die of FIGS. 4A and 4B in subsequent manufacturing steps.

In particular, with reference to FIG. 7, the initial manufacturing steps comprise, inter alia:

forming the body regions 34 in the substrate 35;

growing, on the front surface 35B of the substrate 35, field oxide regions (not shown, forming the bottom part of the gate insulation region 39 of FIG. 4);

forming, above the field oxide regions (not shown) the gate conductive regions 38 (schematically represented in FIG. 7), for example by depositing and defining a polysilicon layer;

forming, above the gate conductive regions 38, intermetal oxide regions (not shown, forming the top part of the gate insulation region 39 of FIG. 4);

forming, in the substrate 35, the source regions 37;

forming the gate contact regions 42 and the source contact regions 45, e.g., by depositing and photolithographically defining a single AlCu metal layer; and forming the gate passivation regions 43, for example by depositing one or more passivation layers for a thickness of 1-10 μm, forming the bottom portions 43A of the gate passivation regions 45 (which extend between the gate contact regions 42 and the source contact regions 45) and the top portions 43B of the gate passivation regions 45 (which extend above the gate contact regions 42 and partially above the source contact regions 45).

Thus, the gate passivation regions 43 form, together with the gate conductive regions 38 (and the gate insulation region 39 of FIG. 4), the projecting gate regions 46 delimiting the windows 47 between each other.

Then the process comprises the steps of forming a barrier layer 50, e.g., of titanium-tungsten, sputtered for a thickness of 0.2 nm and covering the source contact regions 45 and the top portions 43B of the gate passivation regions 43; forming a seed layer 51, e.g., of copper, sputtered for a thickness of 0.1 nm; and forming a redistribution mask 52, which covers the zones where it is not desired to form the source connection regions 48 and which has openings slightly wider than the windows 47 (therefore identified therewith, hereinafter). Thus, the intermediate structure of FIG. 7 is obtained.

Then, FIG. 8, an electro-galvanic copper growth is carried out, for a thickness greater than the gate passivation regions 43. For example, the galvanic growth may be continued until a thickness comprised between 2 and 15 μm, e.g., of 10 μm, is obtained.

Thus, the source connection regions 48 form where the redistribution mask 52 is not present (at the windows 47).

Subsequently, FIG. 9, the redistribution mask 52 is removed and the portions of the seed layer 51 and of the barrier layer 50 above the top portions 43B of the gate passivation regions 43 are removed.

Then, the rear surface 35A of the substrate 35 is lapped and the drain metallization 36 is deposited.

After dicing the wafer to separate the single dice 31, in a known manner, each die 31 is packaged.

Figures 9, 10:
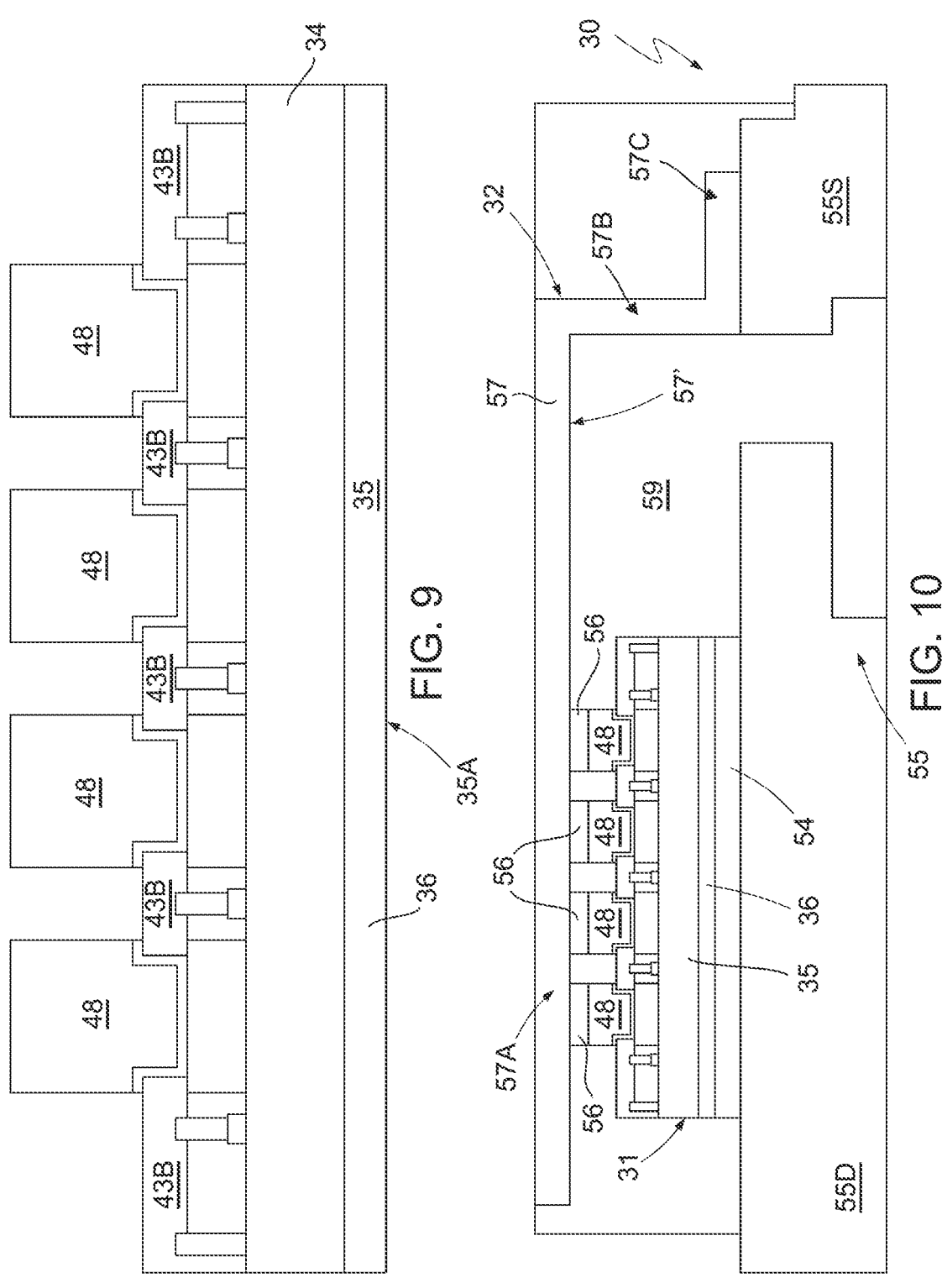

In particular, to this end, and with reference to FIG. 10, a first solder paste layer 54 is deposited on a supporting portion 55D of a conductive support 55 (also called "leadframe"), appropriately shaped and provided with leads, a source lead 55S thereof being visible.

Then the die 31 is placed on the supporting portion 55D of the conductive support 55 (forming a drain lead) with the drain metallization 36 in contact with the first solder paste layer 54. The die 31 is thus coupled to the leadframe 55.

Figures 11, 12, 13:
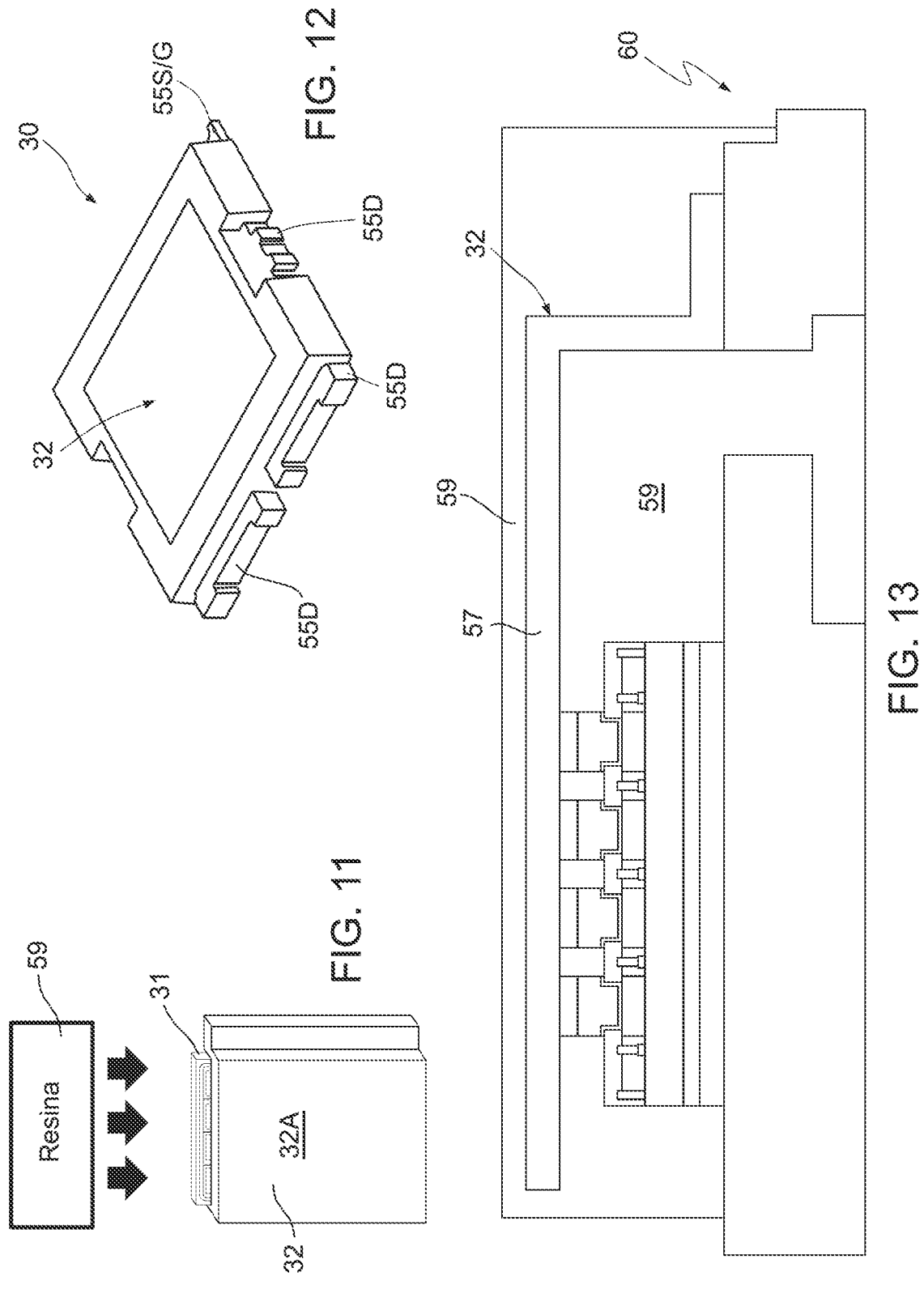
FIG. 11 is a schematic view of a molding step of the high voltage device.
FIG. 12 is a perspective top view of the high voltage device of FIG. 6B at the end of manufacturing.
FIG. 13 shows a cross-section of a different high voltage device.

Gate pads (not visible) are coupled through wires (also not visible) to non-visible gate leads (indicated with 55G in FIG. 12).

A second solder paste layer 56 is deposited on the source connection regions 48, forming the solder regions 49 of FIG. 4; and the dissipating region 32 is placed on the second solder paste layer 56 and on the source leads 55S. In particular, the dissipating region 32 is formed here by a clip 57 having a planar portion 57A.

In particular, the planar portion 57 has a flat connection surface 57' which is simply "laid" on the source connection regions 48 and centered with respect to the die 31 using standard centering marks.

The clip 57 also has a folded portion 57B and a lower portion 57C which lays directly on the source leads 55S.

Then, a package 58, of resin, is molded for insulating the die 31. In particular, as shown in FIG. 11, a fluid mass of resin, indicated with 59, is flowed in a direction parallel to the planar portion 57A of the clip 57, so to fill the space between the die 31 and the clip 57, as well as the space between the supporting portion 55D, the source leads 55S and the gate leads (not visible) of the leadframe 55 (FIG. 10).

FIG. 12 shows the high voltage MOSFET device 30 thus obtained. In this case, the high voltage MOSFET device 30 is double, thermally and electrically, exposed with dual side cooling through the supporting portion 55D of the leadframe 55 and the planar portion 57A of the clip 57.

The solution described above may be used to form a fully packaged high voltage MOSFET device, as shown for example in FIG. 13 and indicated with 60. Here, the dissipating region 32 is formed by a clip 57 equal to that of FIG. 10 and the sealing resin 59 also extends on the planar portion 57A of the clip 57, covering it. Thus, the clip 57 is no longer exposed and the high voltage MOSFET device 60 is electrically insulated on the top side.

Figure 14:
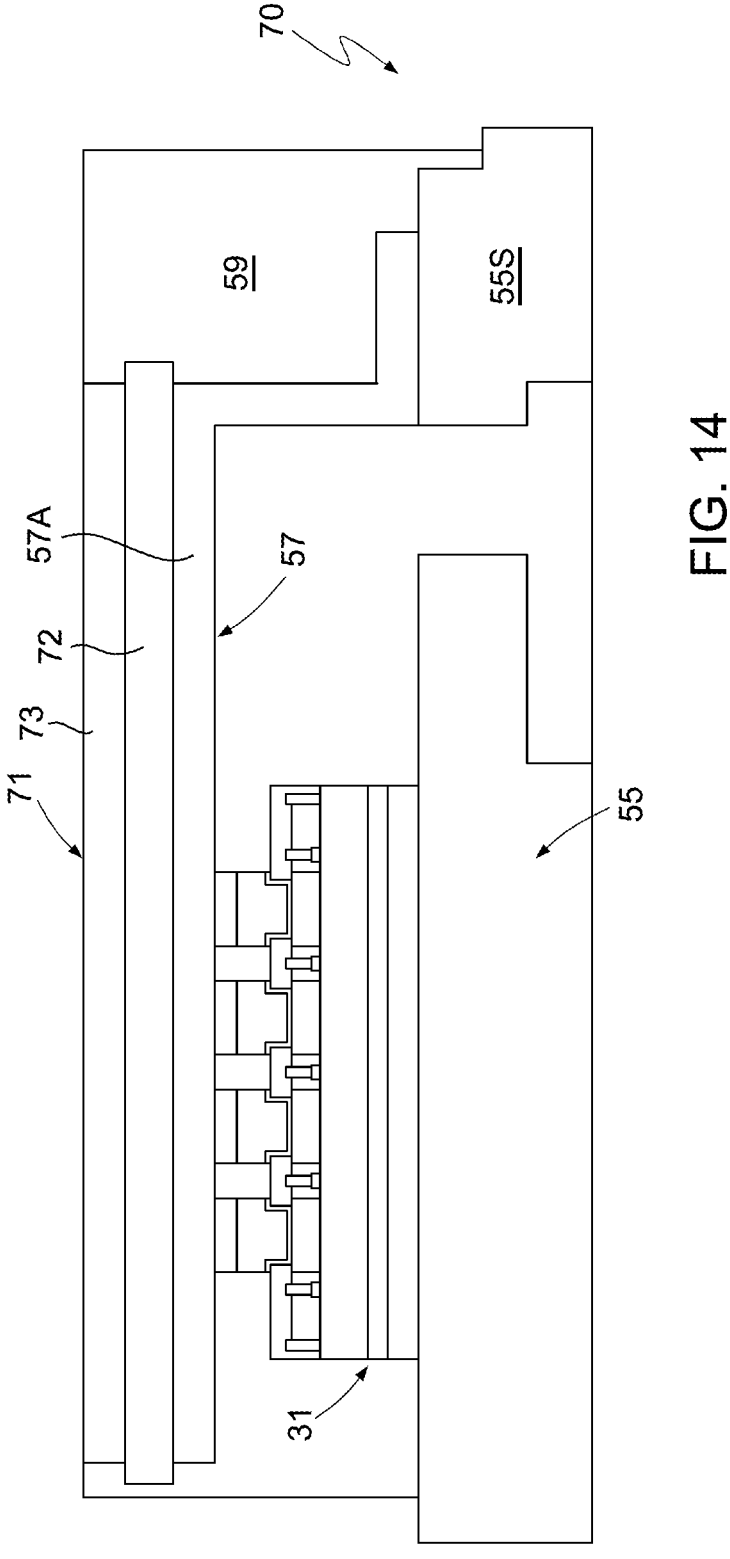
FIG. 14 shows a cross-section of an embodiment of a high voltage device.

The dissipating region 32 may also be formed by a multilayer, as shown in FIG. 14. Here, the high voltage MOSFET device, indicated with 70, has a DBC (Direct Bonded Copper) multilayer 71 formed by a bottom metal layer, formed by the planar portion 57A of the clip 57, by a top metal layer 73, e.g., of copper, and by an intermediate insulating layer 72 of ceramic, for example alumina ($Al_2O_3$), aluminum nitride (AlN) or beryllium oxide (BeO). The intermediate insulating layer 72 electrically insulates the top and bottom metal layers 73 and 57A; the bottom layer 57A is bonded to the die 31 in the manner described above.

Thus, the high voltage MOSFET device 70 of FIG. 14 is double exposed with dual side cooling and only top isolated.

The high voltage MOSFET device 70 of FIG. 14 may be used for applications where very high voltages are desired.

In fact, the bottom metal layer 57A is decoupled from the top metal layer 73 by the intermediate insulating layer 72 and may be shaped and dimensioned according to the requirements, without being limited by safety distances between regions at very different voltages (so called creepage distances) that are considered in the design stage and that may limit the design freedom. Accordingly, in the high voltage MOSFET device 70 of FIG. 14, the top metal layer 73 is safely decoupled from the source connection regions 48 and its distance from the drain metallization 36 is not critical. Therefore, the top metal layer 73 may be designed with a large area, and is able to ensure a very high dissipation.

Figure 15:
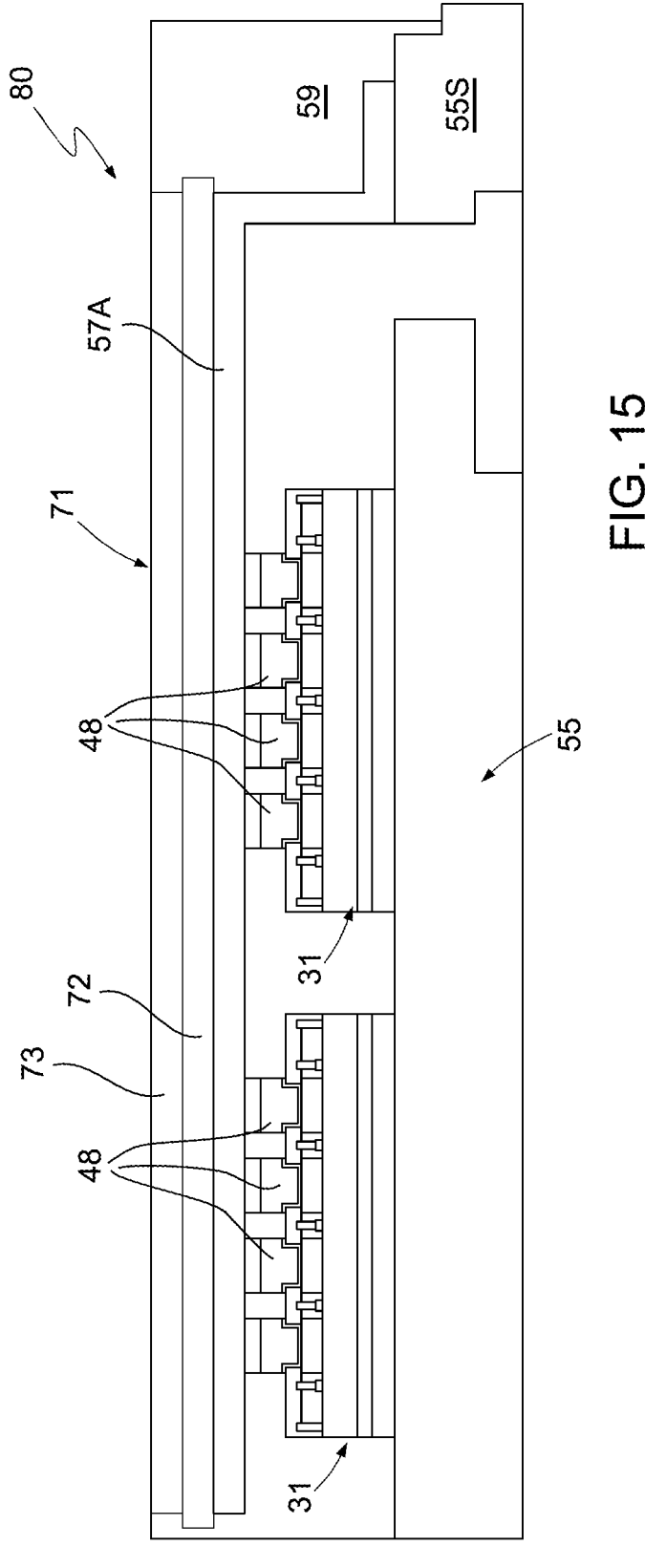
FIG. 15 shows a cross-section of another embodiment of a high voltage device.

The high voltage MOSFET device may also comprise multiple, parallel-connected dice. For example, FIG. 15 shows a high voltage MOSFET device 80 incorporating two dice 31, a single leadframe 55 and a single dissipating region 32, here also formed by a clip 57. Here, the planar portion 57A of the clip 57 is soldered in a planar way to the source connection regions 48 of both dice 31, and electrically couples them to each other as well as to the source leads 55S.

Accordingly, more dice 31 may be coupled in parallel, thereby reducing the resistance R D s on of the high voltage MOSFET device 80. As a result, the safe operating area of the high voltage MOSFET device 80 is enlarged and the device may operate at higher currents.

The dissipating region 32 may or may not completely cover the die or dice 31, as shown in FIGS. 16A, 16B, 17A, 17B.

Figure 16A:
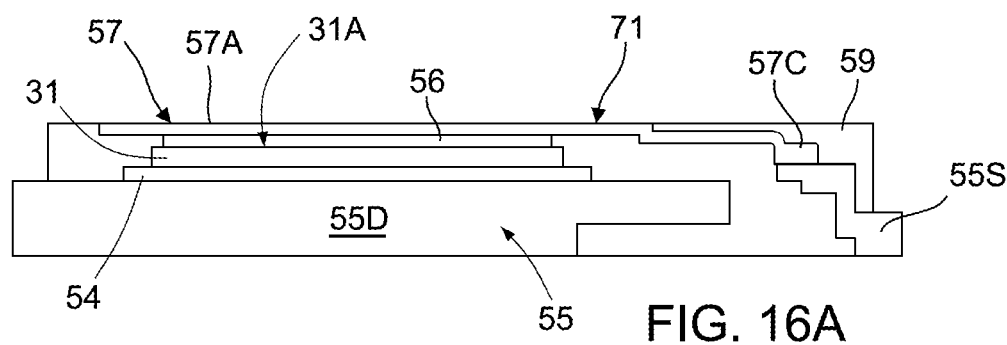
FIGS. 16A and 16B show a lateral view and a perspective view of a different embodiment of the high voltage device.
Figure 16B:
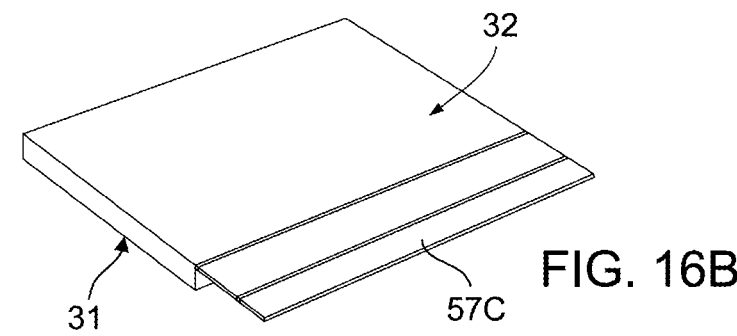

In particular, FIGS. 16A and 16B show an embodiment wherein the dissipating region 32 forms a clip 57 whose planar portion 57A has a greater area with respect to the die 31, so as to completely cover the top surface 31A thereof. Here again, the clip 57 has a lower portion 57C for the connection to the source leads 55S.

Furthermore, the dissipating region 32 is formed by a multilayer, e.g., the DBC multilayer 71 shown in FIG. 14.

Figure 17A:
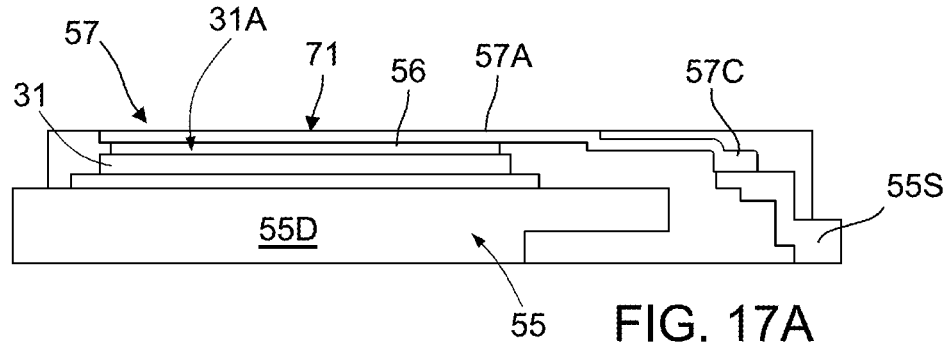
FIGS. 17A and 17B show a lateral view and a perspective view of another embodiment of the high voltage device.
Figure 17B:
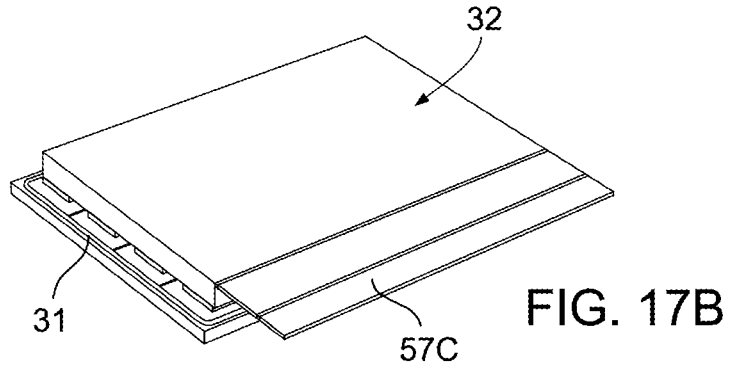

Conversely, FIGS. 17A and 17B show an embodiment wherein the dissipating region 32 does not completely cover the die 31; here, the dissipating region 32 (again formed as a clip 57) leaves part of the top surface 31A of the die 31 exposed and has a lower portion 57C for the connection to the source leads 55S.

Also in this case, the dissipating region 32 is formed by a multilayer, e.g., the DBC multilayer 71 shown in FIG. 14.

The HV MOSFET device described herein has numerous advantages.

In fact, the presence of the source connection regions 48 allows the use of a dissipative plate having a flat bottom surface; this allows the dissipative plate to be designed and sized so that it may be used for HV MOSFET devices of different size and layouts, regardless of the shape, number and size of the contact windows, also due to the fact that the planar portion 57A may or may not completely cover the underlying die, as discussed above.

Furthermore, manufacturing of the dissipative plate is simplified, as well as its arrangement and bonding to the die. In particular, the centering operation is not critical, and small centering errors do not entail the risk of damaging the die or reliability problems in the HV MOSFET device.

The easiness in assembling and the greater easiness in manufacturing the projecting source contact portions (source connection regions 48) directly on the die in a final step of the manufacturing process at wafer level allow manufacturing costs to be reduced.

By sizing the projecting contact portions of suitable height, there are no problems of creepage, i.e., of excessive proximity between regions placed at very different electric differentials, thereby is possible to form few dissipating regions of different size for a large variety of dice, even of small size, and with great layout variability.

If the dissipative plate is part of multilayer structures, it is possible to obtain high electrical insulation, maintaining high thermal dissipation and low parasitic phenomena.

Finally, it is clear that modifications and variations may be made to the HV MOSFET device and to the manufacturing process thereof described and illustrated herein without thereby departing from the scope of the present disclosure, as defined in the attached claims. For example, the different embodiments described may be combined so as to provide further solutions.

For example, the size of the dissipating region 32 may be greater than, equal to or smaller than the size of the die 31 even if it is formed by a DBC multilayer, differently what is shown in FIGS. 16A, 16B and 17A, 17B.

A packaged HV MOSFET device may be summarized as including a semiconductor die (31) including:

a body (35) integrating a plurality of source conductive regions (37) and having a first and a second surface (35B, 35A), a plurality of projecting gate structures (46) arranged on the first surface (35B) of the body, laterally offset with respect to the source conductive regions (37);

a plurality of source contact regions (45), of a first metal, arranged on the first surface (35B) of the body in electric contact with the source conductive regions (37); and a plurality of source connection regions (48), of a second metal, extending above the source contact regions (45) and having a height protruding with respect to the projecting gate structures (46), and a package (59), housing the semiconductor die (31) therein and including:

a support (55), of metal, bonded to the second surface (35A) of the semiconductor die;

a dissipating region (32), extending above the first surface (35B) of the body (35) and comprising a conductive plate (57) having a planar face (57') bonded to the source connection regions (48) and spaced from the projecting gate structures; and a package mass (59) of dielectric material, extending between the support (55) and the dissipating region (32) and incorporating the semiconductor die (31).

The source connection regions (48) may be of copper and the source contact regions (45) may be of copper-aluminum.

The conductive plate (32) may form a planar portion of a metal clip (57) coupled to at least a first lead (55S) extending outside the package (59) and accessible from the outside.

The dissipating region (32) may be a DBC-type insulation multilayer (71) including the conductive plate (57), an intermediate insulating region (72) of ceramic, coupled to the conductive plate (57), and a top conductive region (73), coupled to the intermediate insulating region (72).

The package mass (59) may cover the conductive plate (57).

The package mass (59) may expose the conductive plate (57).

The conductive plate (57) may have a greater area than the semiconductor die (31) and may completely cover semiconductor die.

The conductive plate (57) may not completely cover the semiconductor die (31).

The HV MOSFET device may include a second die (31) parallel-coupled to the semiconductor die (31), having the same structure and carried by the support (55) and the conductive plate (57) may also be coupled to source connection regions (48) of the second die (31).

The source connection regions (48) may have a thickness comprised between 2 and 15 μm, e.g., of 10 μm.

A process for manufacturing an HV MOSFET device may be summarized as including forming a semiconductor die (31) comprising a body (35) integrating a plurality of source conductive regions (37) and having a first and a second surface (35B, 35A);

forming a plurality of projecting gate structures (46) on the first surface (35B) of the body, laterally offset with respect to the source conductive regions (37);

forming a plurality of source contact regions (45), of a first metal, on the first surface (35B) of the body (35), in electric contact with the source conductive regions (37);

forming a plurality of source connection regions (48), of a second metal, above the source contact regions (45) and having a height protruding with respect to the projecting gate structures (46); and forming a package (59), housing the semiconductor die therein and including:

bonding the semiconductor die (31) to a support (55) of metal coupling the second surface of the body to the support, and coupling the first surface (35B) of the body (35) to a dissipating region (32) comprising a conductive plate (57) having a planar face (57') by bonding the planar face of the conductive plate to the source connection regions (48) so that the planar face of the conductive plate extends at a distance from the projecting gate structures (46); and feeding a package mass (59) of dielectric material so that it fills spaces between the support (55) and the dissipating region (32) and incorporates the semiconductor die (31), forming a package.

Forming a plurality of source connection regions (48) may include galvanically growing the source connection regions (48).

The process may further include before galvanically growing the source connection regions (48), forming a seed layer (51) and forming, on the seed layer, a structure definition mask (52) having windows (47) overlying the source contact regions (45).

The conductive plate (32) may form a planar portion (57A) of a metal clip (57) coupled to at least one source lead (55S) extending outside the package (59) and accessible from the outside.

Coupling the first surface (35B) of the body (35) to the dissipating region (32) may include coupling a DBC-type insulation multilayer (71).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a die including:
a substrate having a first surface opposite a second surface along a first direction;
a plurality of source conductive regions extending into the substrate along the first direction from the first surface;
a body region extending into the substrate along the first direction from the first surface;
a plurality of gate structures on the first surface, each gate structure partially covering a first one of the source conductive regions, each gate structure including:
a gate insulation region; and
a gate conductive region including a first portion extending on the first surface of the substrate along a second direction transverse to the first direction, and a second portion extending along the second direction, the gate insulation region being between the second portion and the substrate;
a plurality of source contact regions having a third surface directly on the first surface and partially covering each of the plurality of source conductive regions, each source contact region including a first portion aligned with the gate conductive region and the gate insulation region along the first direction and a second portion directly on the body region, the first portion of each source contact region having a fourth surface further from the body region along the first direction than a fifth surface of the second portion; and
a plurality of source connection regions on the source contact regions; and
a package including:
a metal support coupled to the second surface;
a dissipating region on the first surface and including a conductive plate coupled to the source connection regions, the conductive plate being separated along the first direction from each of the plurality of source contact regions by a first distance and from each of the plurality of gate structures by a second distance greater than the first distance; and
a dielectric material between the metal support and the dissipating region, the die being in the dielectric material.

2. The device of claim 1 wherein the dissipating region is an insulation multilayer that includes the conductive plate.

3. The device of claim 2 wherein the dissipating region includes an intermediate insulating region coupled to the conductive plate.

4. The device of claim 3 wherein the dissipating region includes a top conductive region coupled to the intermediate insulating region.

5. The device of claim 1, wherein each of the plurality of gate structures includes a gate passivation region on a gate contact region.

6. The device of claim 5, wherein the gate insulation region surrounds the gate conductive region and is coupled between the gate contact region and the substrate.

7. The device of claim 6, wherein the gate insulation region entirely separates the gate conductive region from each of the plurality of source contact regions.

8. The device of claim 5, wherein a portion of each source contact region is between the gate passivation region and the substrate along the first direction.

9. A device, comprising:
a package that includes:
a leadframe having a lead and a die support;
a die on the die support, the die including:
a substrate with a first surface opposite a second surface along a first direction;
a plurality of gate conductive regions on the first surface;
a plurality of source contact regions on the first surface adjacent to the plurality of gate conductive regions, the plurality of source contact regions each having a third surface opposite the first surface, the third surface having a first portion that is separated from the first surface by a first distance along the first direction and a second portion that is separated from the first surface by a second distance along the first direction that is greater than the first distance, the second portion being aligned with a respective gate conductive region of the plurality of gate conductive regions along the first direction;
a plurality of gate passivation regions on the plurality of gate conductive regions, the plurality of gate passivation regions having a fourth surface opposite a fifth surface along the first direction, the fourth surface being closer to the first surface along the first direction than the fifth surface is, the first surface and the fourth surface being separated by a third distance along the first direction, the fifth surface having a first portion separated from the first surface along the first direction by a fourth distance greater than the third distance, the fifth surface having a second portion separated from the first surface by a fifth distance greater than the third and fourth distances; and
a barrier layer on the plurality of gate passivation regions and on the plurality of source contact regions.

10. The device of claim 9, further comprising a plurality of source connection regions on the barrier layer.

11. The device of claim 10 wherein the plurality of source connection regions are aligned with the plurality of source contact regions.

12. The device of claim 11 further comprising a plurality of recesses in the plurality of source connection regions.

13. The device of claim 12 further comprising a clip that is coupled between the lead and the plurality of source connection regions.

14. The device of claim 9, wherein each first portion of the fifth surface covers a respective source contact region of the plurality of source contact regions along the first direction.

15. The device of claim 14, wherein each second portion of the fifth surface covers the respective source contact region and a respective gate conductive region of the plurality of gate conductive regions along the first direction.

16. A device, comprising:
a leadframe having a lead and a die support;

a die on the die support, the die including:

a substrate having a first surface;

a body region extending into the substrate along a first direction from the first surface;

a plurality of gate conductive regions;

a plurality of source contact regions;

a plurality of gate passivation regions, each having a first portion separated from the body region along the first direction by one of the plurality of source contact regions and a second portion aligned with one of the plurality of gate conductive regions along the first direction, the second portion extending further from the body region along the first direction than the first portion, each gate passivation region having a second surface with a first portion and a second portion; and a barrier layer on the plurality of gate passivation regions and on the plurality of source contact regions; and a package including a conductive clip, the conductive clip being separated from each of the plurality of source contact regions along a first direction by a first distance, and from each of the plurality of gate passivation regions along the first direction by a second distance greater than the first distance.

17. The device of claim 16 wherein the plurality of gate conductive regions extend away from the substrate and the plurality of source contact regions are spaced from each other by the plurality of gate conductive regions.

18. The device of claim 17 wherein each of the plurality of gate passivation regions are on ones of the plurality of gate conductive regions.

19. The device of claim 18 further comprising a plurality of source connection regions on the barrier layer.

20. The device of claim 19 wherein the plurality of source connection regions are aligned with the plurality of source contact regions.

* * * * *